(12) United States Patent
Asakawa et al.

(10) Patent No.: US 8,457,788 B2
(45) Date of Patent: Jun. 4, 2013

(54) METHOD FOR TEACHING CARRIER MEANS, STORAGE MEDIUM AND SUBSTRATE PROCESSING APPARATUS

(75) Inventors: Takashi Asakawa, Oshu (JP); Haruoki Nakamura, Oshu (JP); Masayuki Enomoto, Akashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/526,700

(22) Filed: Jun. 19, 2012

(65) Prior Publication Data

US 2012/0316678 A1    Dec. 13, 2012

Related U.S. Application Data

(62) Division of application No. 12/389,512, filed on Feb. 20, 2009, now Pat. No. 8,255,082.

(30) Foreign Application Priority Data

Feb. 29, 2008  (JP) ................................. 2008-050759

(51) Int. Cl.
   *G06F 19/00*  (2011.01)
(52) U.S. Cl.
   USPC ........................................................ 700/251
(58) Field of Classification Search
   USPC ........................................................ 700/245
   See application file for complete search history.

(56) References Cited

U.S. PATENT DOCUMENTS

| | | | | |
|---|---|---|---|---|
| 2003/0016860 A1* | 1/2003 | Sugawara | ..................... | 382/151 |
| 2006/0138681 A1* | 6/2006 | Best et al. | ..................... | 257/797 |
| 2006/0219070 A1* | 10/2006 | Yodokawa et al. | ................ | 83/13 |
| 2007/0218737 A1* | 9/2007 | Suhara | ........................... | 439/259 |
| 2008/0250636 A1* | 10/2008 | Okuda et al. | .................... | 29/834 |

FOREIGN PATENT DOCUMENTS

| | | |
|---|---|---|
| JP | 11-314890 | 11/1899 |
| JP | 9-148404 | 6/1997 |
| JP | 9-199571 | 7/1997 |
| JP | 2005-170544 | 6/2005 |
| JP | 2005-260176 | 9/2005 |

OTHER PUBLICATIONS

M. Iguchi et al., "Three-dimensional Imaging Techniques for Measurement", Nov. 1990.
Japanese Office Action issued on Nov. 8, 2011 for Application No. 2008-050759 with English translation.
Korean Office Action issued on Apr. 25, 2012 for Application No. 10-2009-15526 with English translation.

* cited by examiner

*Primary Examiner* — Hussein A. Elchanti
(74) *Attorney, Agent, or Firm* — Smith, Gambrell & Russell, LLP

(57) ABSTRACT

In a substrate processing apparatus, before a carrier is carried by a carrier arm, a carrier jig is held by a holding part provided to the carrier arm. First, the carrier arm is actuated to move the holding part of the carrier arm to a preset lowering start position. Then, an image including an opening in a table is taken. Thereafter, a distance between a central position of the opening and a central position of a region of the image is calculated, so as to obtain an amount of horizontal positional shift between the preset lowering start position and an ideal position. The lowering start position of the holding part is corrected by the positional shift as a correction value, whereafter the carrier is placed on the table at the corrected lowering start position.

2 Claims, 12 Drawing Sheets

TEACHING DATA

| POSITION TO WHICH THE CARRIER IS CARRIED | DESIGNED POSITION | CORRECTION AMOUNT | IDEAL POSITION |
|---|---|---|---|
| 1 (STORAGE UNIT24) | A1(xA1,yA1,zA1) | Δx1,Δy1,Δz1 | B1(xB1,yB1,zB1) |
| 2 (STORAGE UNIT24) | A2(xA2,yA2,zA2) | Δx2,Δy2,Δz2 | B2(xB2,yB2,zB2) |
| 3 (STORAGE UNIT24) | A3(xA3,yA3,zA3) | Δx3,Δy3,Δz3 | B3(xB3,yB3,zB3) |
| ------- | ------- | ------- | ------- |
| 20 (LOAD PORT21) | A20(xA20,yA20,zA20) | Δx20,Δy20,Δz20 | B20(xB20,yB20,zB20) |

METHOD FOR TEACHING CARRIER MEANS, STORAGE MEDIUM AND SUBSTRATE PROCESSING APPARATUS

CROSS REFERENCE TO RELATED APPLICATION

This application is a division of Ser. No. 12/389,512 filed Feb. 20, 2009, which is being incorporated in its entirety herein by reference.

CROSS REFERENCE TO RELATED APPLICATIONS

This application is based on the prior Japanese Patent Application No. 2008-050759 filed on Feb. 29, 2008, the entire contents of which are incorporated herein by reference.

BACKGROUND OF THE INVENTION

1. Field of the Invention

The present invention relates to a method for teaching a carrier means for carrying a carrier container, in a substrate processing apparatus configured for carrying the carrier container storing therein a plurality of substrates into the interior of the apparatus, taking out each substrate from the carrier container, then providing a process to the substrate. This invention also relates to a storage medium for storing the above method therein, as well as relates to the substrate processing apparatus.

2. Background Art

As one example of semiconductor manufacturing apparatuses, a batch-type vertical substrate processing apparatus configured for providing a heating process, e.g., an oxidizing process and/or film-forming process, to multiple sheets of substrates, e.g., semiconductor wafers (hereinafter, referred to as "wafers"), is known. An internal space of such an apparatus is divided, by partition walls or the like, into a working area for carrying closed-type carriers, each storing therein the multiple sheets, e.g., 25 sheets, of wafers, into the interior of the apparatus, a loading area for loading or transferring the wafers stored in each carrier onto a wafer boat, and a space for installing therein a heating furnace adapted for heating the wafers. To the partition wall located on the side of the working area, tables, each used for placing one carrier thereon, are provided as transfer stages. In this case, once one of the carriers is placed on one of the transfer stages, each wafer will be taken out from the carrier by a transfer mechanism provided on the side of the loading area. In this way, the carriers are placed, successively, on the transfer stages, and the wafers are taken out from each carrier and loaded onto the wafer boat, until the number of the sheets of wafers reaches a predetermined value (e.g., 100). Thereafter, each carrier, from which the wafers have been taken out, is stored in one of storage units located in the working area, then returned onto the transfer stage. After the heating process is ended, processed wafers will be stored again in the returned carrier.

In this manner, the apparatus provides a desired process to the multiple sheets of wafers. Therefore, the tables, each used for placing each carrier thereon in the working area, include, for example, a total of twenty units or stages, such as two load ports, two transfer stages and 16 storage units. In this case, the carriers are successively carried into the apparatus from the exterior.

A coordinate position (or position on the coordinates of a drive system) of a carrier arm, upon transferring each carrier onto each table by using the carrier arm, can be obtained by each length and/or distance of interest set in advance in a design drawing. Actually, however, because of errors associated with assembling the apparatus and/or errors in the drive system caused, such as by elongation of belts and the like, each constituting the system, the coordinate position of the carrier arm on the design drawing may be somewhat shifted from an ideal position of the carrier arm for a transfer operation. Namely, in such an ideal position, the carrier can be carried to a position accurately matched with the position of the table. However, not only upon assembling the apparatus, such a positional shift may also be caused by wear of ball screws and other like parts, due to prolonged continuation of operation of the apparatus. In order to address such problems, it is necessary for an operator to do work referred to as "teaching", upon starting and/or maintaining the apparatus. Namely, such teaching work is required for obtaining each position of the carrier arm on the coordinates of the drive system, when the carrier arm transfers each carrier. More specifically, each coordinate position of the carrier arm can be displayed, for example, on a screen of the apparatus. Thus, the operator can move the carrier arm to each transfer position for the carrier, in accordance with a manual, while confirming the carrier and carrier arm on the screen, with the carrier being held by the carrier arm. Thus, the coordinated position of the carrier arm, at the time when the carrier arm reaches the transfer position, can be set as a carrier transfer position.

However, since the operator should do such teaching work in accordance with the manual, the carrier transfer position may include some errors and variations, depending on a degree of experience and skill of the operator and/or by mistakes of the operator upon an input operation or the like. Additionally, in the case of employing the batch-type heating apparatus as described above, there are so many (e.g., 20) units or stages installed therein and requiring the teaching work. Therefore, in such a case, the teaching work should be considerably complicated and take much time.

Patent Document 1 describes one exemplary substrate processing apparatus, while Patent Document 2 discloses a method for obtaining information on a position, to which the semiconductor wafers are carried. However, neither of these Patent Documents refers to any challenges for addressing the aforementioned problems.

Patent Document 1: JP11-314890A (Paragraphs [0010] to [0013], and FIG. 1)
Patent Document 2: JP2005-260176A (Paragraphs [0105] to [0108], and FIG. 2)

SUMMARY OF THE INVENTION

The present invention was made in light of the above circumstances, and it is therefore an object of this invention to provide a new teaching method, a storage medium for storing this teaching method therein and a new substrate processing apparatus. The teaching method, storage medium and substrate processing apparatus related to this invention are all intended to teach the carrier means for carrying the carrier container, more readily and accurately, in the substrate processing apparatus configured for carrying the carrier container storing therein the plurality of substrates into the interior of the apparatus, taking out each substrate from the carrier container, then providing a necessary process to the substrate.

The present invention is a method for teaching a carrier means, wherein the method is used for a substrate processing apparatus including a table for placing thereon a carrier container storing substrates therein, the carrier means, which has a holding part for holding the carrier container and a drive unit, and is adapted for transferring the carrier container onto the table, a coordinate position monitoring unit adapted for monitoring a coordinate position of the holding part on the coordinates of a drive system, based on an output of an encoder connected with the drive unit of the carrier means, and a carrier control unit adapted for controlling the carrier means, the method comprising the steps of: having the holding part of the carrier means hold a carrier jig, in a predetermined position of the holding part, the carrier jig being provided with an image obtaining means facing downward; having the holding part of the carrier means move to a preset lowering start position, in which the holding part will start to be lowered; obtaining an image of a marker provided to the table and used for detecting a positional shift, by using the image obtaining means, comparing a position of the marker obtained in a view of the image obtaining means, with the position of the marker in the view of the image obtaining means when the holding part is assumed to be in an ideal position of the lowering start position, calculating a correction amount for the lowering start position, then storing the calculated correction amount in a memory, whereby the preset lowering start position can be corrected with the correction amount, thereby obtaining the coordinate position of the holding part on the coordinates of a drive system, corresponding to the corrected lowering start position of the holding part.

Alternatively, the present invention is a method for teaching a carrier means, wherein the method is used for a substrate processing apparatus including a table for placing thereon a carrier container storing substrates therein, the carrier means, which has a holding part for holding the carrier container and a drive unit, and is adapted for transferring the carrier container onto the table, a coordinate position monitoring unit adapted for monitoring a coordinate position of the holding part on the coordinates of a drive system, based on an output of an encoder connected with the drive unit of the carrier means, and a carrier control unit adapted for controlling the carrier means, the method comprising the steps of: having the holding part of the carrier means hold a carrier jig, in a predetermined position of the holding part, the carrier jig being provided with an image obtaining means facing upward; actuating the carrier means to move the holding part of the carrier means to a preset lower position below the table; obtaining an image of a marker provided to the table and used for detecting a positional shift, by using the image obtaining means, comparing a position of the marker obtained in a view of the image obtaining means, with the position of the marker in the view of the image obtaining means when the holding part is assumed to be in an ideal position of the lower position, calculating a correction amount for the lower position, then storing the calculated correction amount in a memory, whereby the preset lower position can be corrected with the correction amount, so as to obtain a corrected lower position of the holding part, thereby obtaining the coordinate position of the holding part on the coordinates of the drive system, corresponding to a lowering start position in which the holding part will start to be lowered, from the corrected lower position.

In the method for teaching the carrier means according to this invention, the table is provided in large numbers, wherein the step of having the holding part of the carrier means move to the preset lowering start position and the step of calculating the correction amount and storing it in the memory are performed, successively, for each table, so as to assign the calculated correction amount for the lowering start position to each table and store it in the memory.

In the method for teaching the carrier means according to this invention, the table is provided in large numbers, wherein the step of having the holding part of the carrier means move to the preset lower position and the step of calculating the correction amount and storing it in the memory are performed, successively, for each table, so as to assign the calculated correction amount for the lower position to each table and store it in the memory.

In the method for teaching the carrier means according to this invention, the coordinate position of the holding part on the coordinates of the drive system is a position on the coordinates in a horizontal plane.

Alternatively, the present invention is a method for teaching a carrier means, wherein the method is used for a substrate processing apparatus including a table for placing thereon a carrier container storing substrates therein, the carrier means, which has a holding part for holding the carrier container, a drive unit and a measuring means, and is adapted for transferring the carrier container onto the table, a coordinate position monitoring unit adapted for monitoring a coordinate position of the holding part on the coordinates of a drive system, in both of horizontal and vertical directions, based on an output of an encoder connected with the drive unit of the carrier means, and a carrier control unit adapted for controlling the carrier means, the method comprising the steps of: having the holding part of the carrier means hold a carrier jig, in a predetermined position of the holding part, the carrier jig being provided with an image obtaining means facing downward; having the holding part of the carrier means move to a preset lowering start position, in which the holding part will start to be lowered; obtaining an image of a marker provided to the table and used for detecting a positional shift, by using the image obtaining means, comparing a position of the marker obtained in a view of the image obtaining means, with the position of the marker in the view of the image obtaining means when the holding part is assumed to be in an ideal position of the lowering start position, while measuring a distance in the vertical direction between the holding part and the table by using the measuring means, further comparing the measured distance in the vertical direction with the distance in the vertical direction between the holding part and the table when the holding part is assumed to be in the ideal position of the lowering start position, calculating each correction amount, in both of the horizontal and vertical directions, for the lowering start position, then storing the calculated correction amount in a memory, whereby the preset lowering start position can be corrected with the correction amount, thereby obtaining the coordinate position of the holding part on the coordinates of a drive system, in both of the horizontal and vertical directions, corresponding to the corrected lowering start position of the holding part.

Alternatively, the present invention is a method for teaching a carrier means, wherein the method is used for a substrate processing apparatus including a table for placing thereon a carrier container storing substrates therein, the carrier means, which has a holding part for holding the carrier container, a drive unit and a measuring means, and is adapted for transferring the carrier container onto the table, a coordinate position monitoring unit adapted for monitoring a coordinate position of the holding part on the coordinates of a drive system, based on an output of an encoder connected with the drive unit of the carrier means, and a carrier control unit adapted for controlling the carrier means, the method comprising the steps of: having the holding part of the carrier means hold a carrier jig, in a predetermined position of the holding part, the carrier jig being provided with an image obtaining means facing upward; actuating the carrier means to move the holding part of the carrier means to a preset lower position below the table; obtaining an image of a marker provided to the table and used for detecting a positional shift, by using the image obtaining means, comparing a position of the marker obtained in a view of the image obtaining means, with the position of the marker in the view of the image obtaining means when the holding part is assumed to be in an ideal position of the lower position, while measuring a distance in the vertical direction between the holding part and the table by using the measuring means, further comparing the measured distance in the vertical direction with the distance in the vertical direction between the holding part and the table when the holding part is assumed to be in the ideal position of the lower position, calculating a correction amount for the lower position, then storing the calculated correction amount in a memory, whereby the preset lower position can be corrected with the correction amount, so as to obtain a corrected lower position of the holding part, thereby obtaining the coordinate position of the holding part on the coordinates of a drive system, in both of horizontal and vertical directions, corresponding to a lowering start position in which the holding part will start to be lowered, from the corrected lower position.

In the method for teaching the carrier means according to this invention, the carrier jig is provided with a light radiation part adapted for radiating light onto a region including the marker, wherein the step of obtaining the image comprises radiating the light onto the region including the marker, so as to obtain an image of a position irradiated with the light, in the region including the marker.

In the method for teaching the carrier means according to this invention, the table is a reflecting part adapted for reflecting the light, while the marker is a non-reflecting part that cannot reflect the light.

In the method for teaching the carrier means according to this invention, the table is a load port adapted for placing the carrier container thereon when the carrier container is carried into the substrate processing apparatus from the exterior thereof, or a transfer stage adapted for placing the carrier container thereon when each of the substrates is taken out from the carrier container, or a storage unit adapted for placing the carrier container thereon, in order to temporarily store the carrier container therein.

Alternatively, the present invention is a storage medium for storing therein a computer program for driving a computer to execute a method for teaching a carrier means, wherein the method for teaching the carrier means is used for a substrate processing apparatus including a table for placing thereon a carrier container storing substrates therein, the carrier means, which has a holding part for holding the carrier container and a drive unit, and is adapted for transferring the carrier container onto the table, a coordinate position monitoring unit adapted for monitoring a coordinate position of the holding part on the coordinates of a drive system, based on an output of an encoder connected with the drive unit of the carrier means, and a carrier control unit adapted for controlling the carrier means, the method comprising the steps of: having the holding part of the carrier means hold a carrier jig, in a predetermined position of the holding part, the carrier jig being provided with an image obtaining means facing downward; having the holding part of the carrier means move to a preset lowering start position, in which the holding part will start to be lowered; obtaining an image of a marker provided to the table and used for detecting a positional shift, by using the image obtaining means, comparing a position of the marker obtained in a view of the image obtaining means, with the position of the marker in the view of the image obtaining means when the holding part is assumed to be in an ideal position of the lowering start position, calculating a correction amount for the lowering start position, then storing the calculated correction amount in a memory, whereby the preset lowering start position can be corrected with the correction amount, thereby obtaining the coordinate position of the holding part on the coordinates of a drive system, corresponding to the corrected lowering start position of the holding part.

Alternatively, the present invention is a storage medium for storing therein a computer program for driving a computer to execute a method for teaching a carrier means, wherein the method for teaching the carrier means is used for a substrate processing apparatus including a table for placing thereon a carrier container storing substrates therein, the carrier means, which has a holding part for holding the carrier container and a drive unit, and is adapted for transferring the carrier container onto the table, a coordinate position monitoring unit adapted for monitoring a coordinate position of the holding part on the coordinates of a drive system, based on an output of an encoder connected with the drive unit of the carrier means, and a carrier control unit adapted for controlling the carrier means, the method comprising the steps of: having the holding part of the carrier means hold a carrier jig, in a predetermined position of the holding part, the carrier jig being provided with an image obtaining means facing upward; actuating the carrier means to move the holding part of the carrier means to a preset lower position below the table; obtaining an image of a marker provided to the table and used for detecting a positional shift, by using the image obtaining means, comparing a position of the marker obtained in a view of the image obtaining means, with the position of the marker in the view of the image obtaining means when the holding part is assumed to be in an ideal position of the lower position, calculating a correction amount for the lower position, then storing the calculated correction amount in a memory, whereby the preset lower position can be corrected with the correction amount, so as to obtain a corrected lower position of the holding part, thereby obtaining the coordinate position of the holding part on the coordinates of the drive system, corresponding to a lowering start position in which the holding part will start to be lowered, from the corrected lower position.

Alternatively, the present invention is a substrate processing apparatus including a table for placing thereon a carrier container storing substrates therein, a carrier means, which has a holding part for holding the carrier container and a drive unit, and is adapted for transferring the carrier container onto the table, and a controller including a coordinate position monitoring unit adapted for monitoring a coordinate position of the holding part on the coordinates of a drive system, based on an output of an encoder connected with the drive unit of the carrier means, and a carrier control unit adapted for controlling the carrier means, wherein the substrate processing apparatus is configured for teaching the carrier means in accordance with a method using the controller, the method for teaching the carrier means comprising the steps of: having the holding part of the carrier means hold a carrier jig, in a predetermined position of the holding part, the carrier jig being provided with an image obtaining means facing downward; having the holding part of the carrier means move to a preset lowering start position, in which the holding part will start to be lowered; obtaining an image of a marker provided to the table and used for detecting a positional shift, by using the image obtaining means, comparing a position of the marker obtained in a view of the image obtaining means, with the position of the marker in the view of the image obtaining means when the holding part is assumed to be in an ideal position of the lowering start position, calculating a correction amount for the lowering start position, then storing the calculated correction amount in a memory, whereby the preset lowering start position can be corrected with the correction amount, thereby obtaining the coordinate position of the holding part on the coordinates of a drive system, corresponding to the corrected lowering start position of the holding part.

Alternatively, the present invention is a substrate processing apparatus including a table for placing thereon a carrier container storing substrates therein, a carrier means, which has a holding part for holding the carrier container and a drive unit, and is adapted for transferring the carrier container onto the table, and a controller including a coordinate position monitoring unit adapted for monitoring a coordinate position of the holding part on the coordinates of a drive system, based on an output of an encoder connected with the drive unit of the carrier means, and a carrier control unit adapted for controlling the carrier means, wherein the substrate processing apparatus is configured for teaching the carrier means in accordance with a method using the controller, the method for teaching the carrier means comprising the steps of: having the holding part of the carrier means hold a carrier jig, in a predetermined position of the holding part, the carrier jig being provided with an image obtaining means facing upward; actuating the carrier means to move the holding part of the carrier means to a preset lower position below the table; obtaining an image of a marker provided to the table and used for detecting a positional shift, by using the image obtaining means, comparing a position of the marker obtained in a view of the image obtaining means, with the position of the marker in the view of the image obtaining means when the holding part is assumed to be in an ideal position of the lower position, calculating a correction amount for the lower position, then storing the calculated correction amount in a memory, whereby the preset lower position can be corrected with the correction amount, so as to obtain a corrected lower position of the holding part, thereby obtaining the coordinate position of the holding part on the coordinates of a drive system, corresponding to a lowering start position in which the holding part will start to be lowered, from the corrected lower position.

In the semiconductor processing apparatus according to the present invention, which is configured for carrying the carrier container storing therein a plurality of substrates into the interior of the apparatus, taking out each substrate from the carrier container, then providing a necessary process to the substrates, the jig used for teaching work is held by the carrier means then moved to the preset lowering start position above the table, when the teaching work for the carrier means adapted for carrying the carrier container is performed, for example, upon starting the apparatus. Thereafter, the image of the marker provided to the table and used for detecting the positional shift is taken by the image obtaining means provided to the jig. Subsequently, the correction amount for the lowering start position relative to the ideal position thereof is calculated, based on the result of the step of obtaining the image. Consequently, the lowering start position can be corrected with the correction amount, thereby to obtain the coordinate position of the carrier means on the coordinates of the drive system, corresponding to the ideal position. Thus, the teaching work can be performed automatically, with higher accuracy, without depending on a degree of experience and skill of the operator. In addition, this teaching work can eliminate necessity that the operator should go to each place where the table is provided and do the teaching work for the table, as well as can save time required for the operator to check and obtain the coordinate position, for each table, on the screen.

Therefore, this invention can significantly facilitate the teaching work, as such substantially reducing the time required for the work.

BRIEF DESCRIPTION OF THE DRAWINGS

FIG. 12 is a diagram for illustrating one example of teaching data obtained by the teaching work performed in the substrate processing apparatus.

DETAILED DESCRIPTION OF THE INVENTION

Examples

Figure 1:
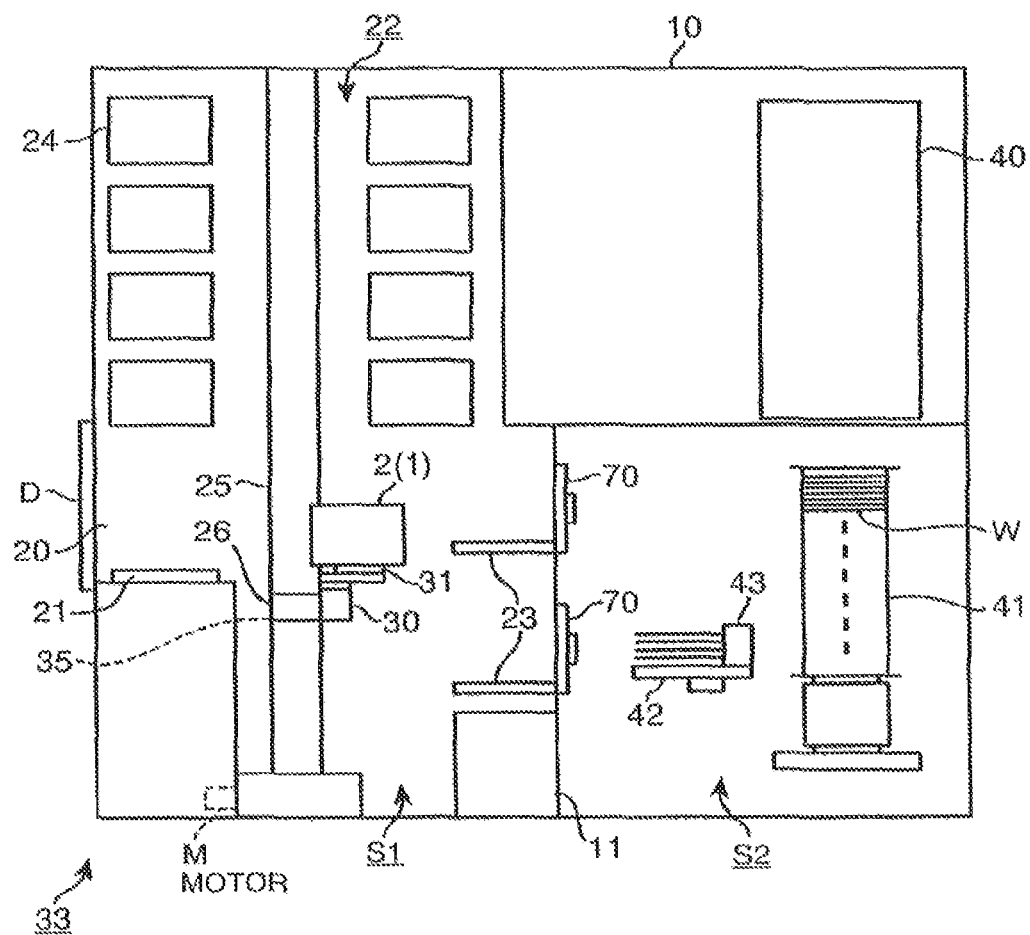
FIG. 1 is a schematic view showing one example of a substrate processing apparatus of the present invention.
Figure 2:
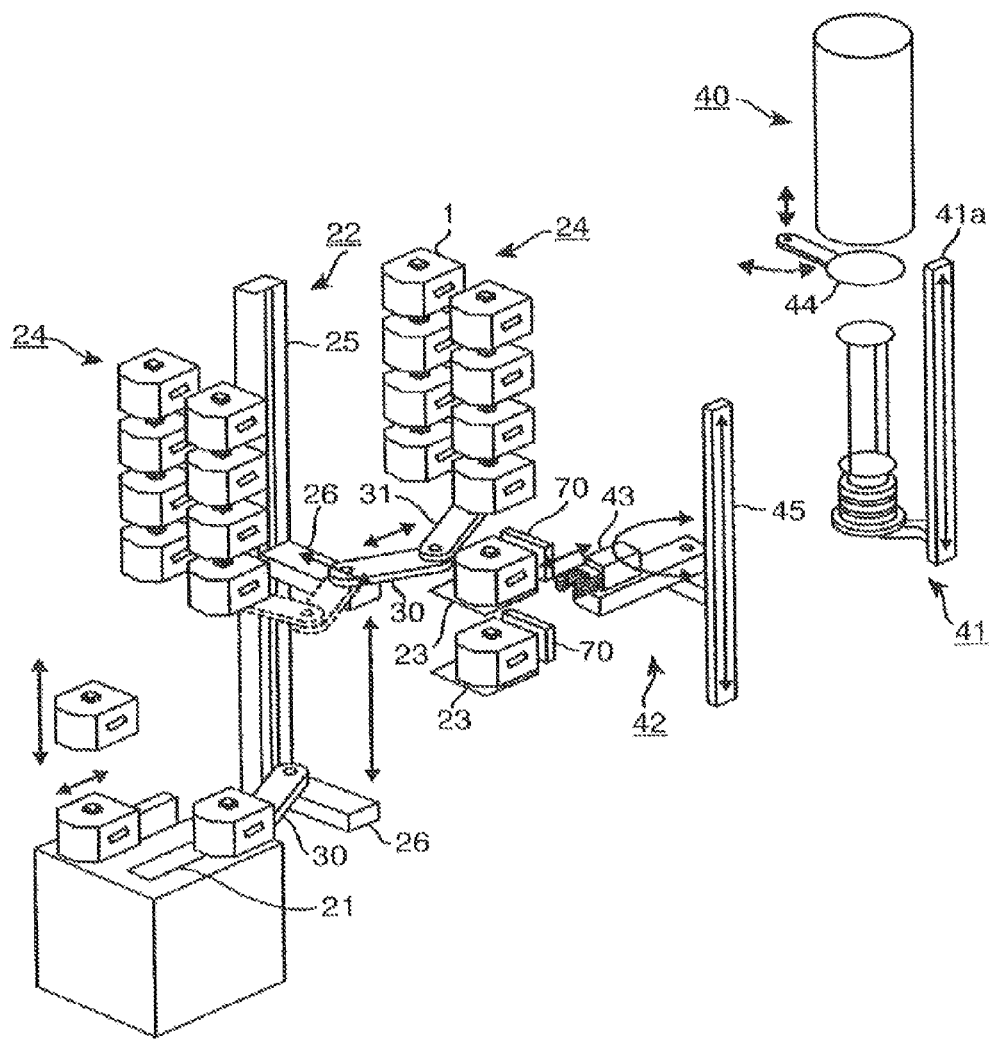
FIG. 2 is a perspective view of the substrate processing apparatus.

Hereinafter, one exemplary embodiment of a substrate processing apparatus of the present invention will be described, with reference to FIGS. 1 to 6. In FIG. 1, reference numeral 10 denotes a housing of the substrate processing apparatus. The housing 10 is divided into a working area S1 depicted on the left side and a loading area S2 on the right side, by a partition wall 11. The working area S1 is provided for carrying and storing therein each carrier 1 which is a closed-type carrier container for storing therein multiple sheets (e.g., 25 sheets) of semiconductor wafers (hereinafter referred to as "wafers"). This working area S1 is kept under an ambient atmospheric condition. As shown in the drawing, while a FOUP is used as each closed-type carrier, this is also referred to as the "carrier" herein. In the working area S1, a suitable number of load ports 21, transfer stages 23 and storage units 24 are provided, respectively. Specifically, as shown in FIG. 2, the load ports 21 are provided in the working area S1, for example, in two positions, on front and back sides thereof. Each load port 21 is used as a table for placing thereon each carrier 1 carried into the housing 10 from a transfer port 20 provided in a side wall of the housing 10 by an external carrier mechanism (not shown). The transfer stages 23 are attached to the partition wall 11, for example, in vertically spaced two positions. Each transfer stage 23 is also used as the table for placing thereon each carrier 1, when the wafers W are taken out from the carrier 1 in the working area S1 by a transfer mechanism 42

(which will be described later) located in the loading area S2. The storage units 24 are respectively provided in an upper portion of the working area S1, and used as the tables for storing the carriers 1 therein. In addition, a carrier transporter 22, which is a carrier means for carrying each carrier 1 in the working area S1, is provided between the load ports 21 and the transfer stages 23. Further, a door D is provided in a position corresponding to the transfer port 20, on the outside of the housing 10. This door 10 is configured to optionally open and close the transfer port 20.

Figure 3:
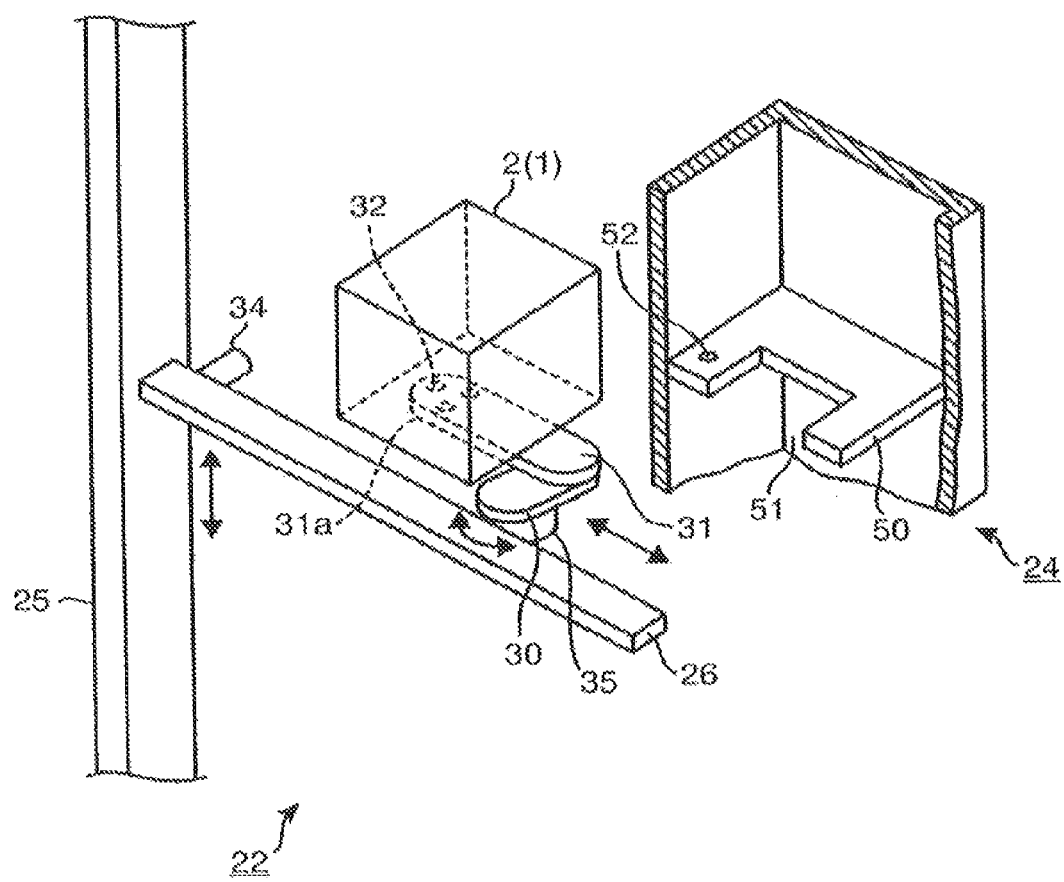
FIG. 3 is a perspective view showing one example of a carrier transporter used in the substrate processing apparatus.
Figure 4:
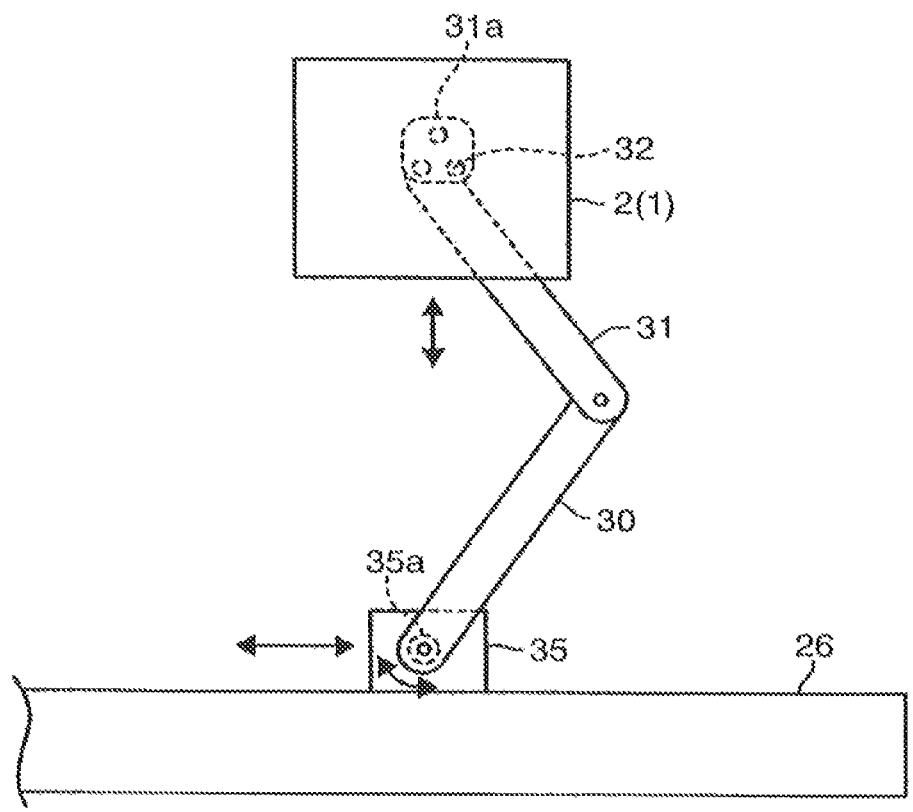
FIG. 4 is a plan view showing the carrier transporter.

As shown in FIG. 2, the storage units 24 are provided in a group and arranged, for example, in four rows in a longitudinal direction and in two rows in a lateral direction. In this case, two groups of the storage units 24 are provided on both sides of a carrier region for the carriers 1, each carried by the carrier transporter 22, while each opening side of the storage units 24 is opposed to the carrier region. As shown in FIG. 3, a carrier stage 50, i.e., a face of each storage unit 24, for placing the carrier 1 thereon, has a rectangular opening 51 formed therein and opened toward the carrier region of the carrier transporter 22. A carrier arm 31, which will be described later, is provided to the carrier transporter 22. In this case, the carrier 1 can be transferred between each carrier stage 50 and the carrier transporter 22, due to vertical movement of the carrier arm 31 through the opening 51. In each carrier stage 50, for example, a circular opening 52, used as a marker for detecting a positional shift, is provided beside the opening 51. As will be described later, the opening 52 is used as the marker for alignment (i.e., the detection of the positional shift), upon teaching the carrier arm 31 by using a carrier jig 2. It should be appreciated that the above opening 52 and opening 51 configured for allowing the carrier arm 31 to pass therethrough are also provided in each face, for placing the carrier 1 thereon, of the aforementioned load ports 21 and transfer stages 23, in the same manner as the carrier stages 50.

The carrier transporter 22 includes a strut 25 vertically extending in the housing 10, and a horizontal arm 26 provided to a side face of the strut 25, wherein the arm 26 can take any suitable position horizontally extending between the two groups of the storage units 24. Namely, the horizontal arm 26 can be optionally moved in the vertical direction, together with, for example, a vertical movement of a timing belt (not shown) provided in the strut 25 and driven by a motor M provided to a lower portion of the strut 25. The motor M incorporates an encoder (not shown), so that the height of the horizontal arm 26 can be obtained or detected by each value given from the encoder. To the horizontal arm 26, the carrier arm 31 is provided, such that it can be horizontally moved along the horizontal arm 26, via a guide mechanism 35, including a pivotal shaft 35a, by a motor 34. The carrier arm 31 is composed of an articulated arm including two arms 30, 30 and a holding part 31a. The carrier arm 31 is configured, such that the entire body thereof can be rotated about a vertical axis, while the holding part 31a can be moved straight. Thus, the position of the holding part 31a can be controlled, based on an amount of movement, with respect to a rotation angle (θ), due to a motor used for the rotation, as well as on the amount of movement, in advance and retract directions, due to another motor used for the straight movement.

Figure 5:
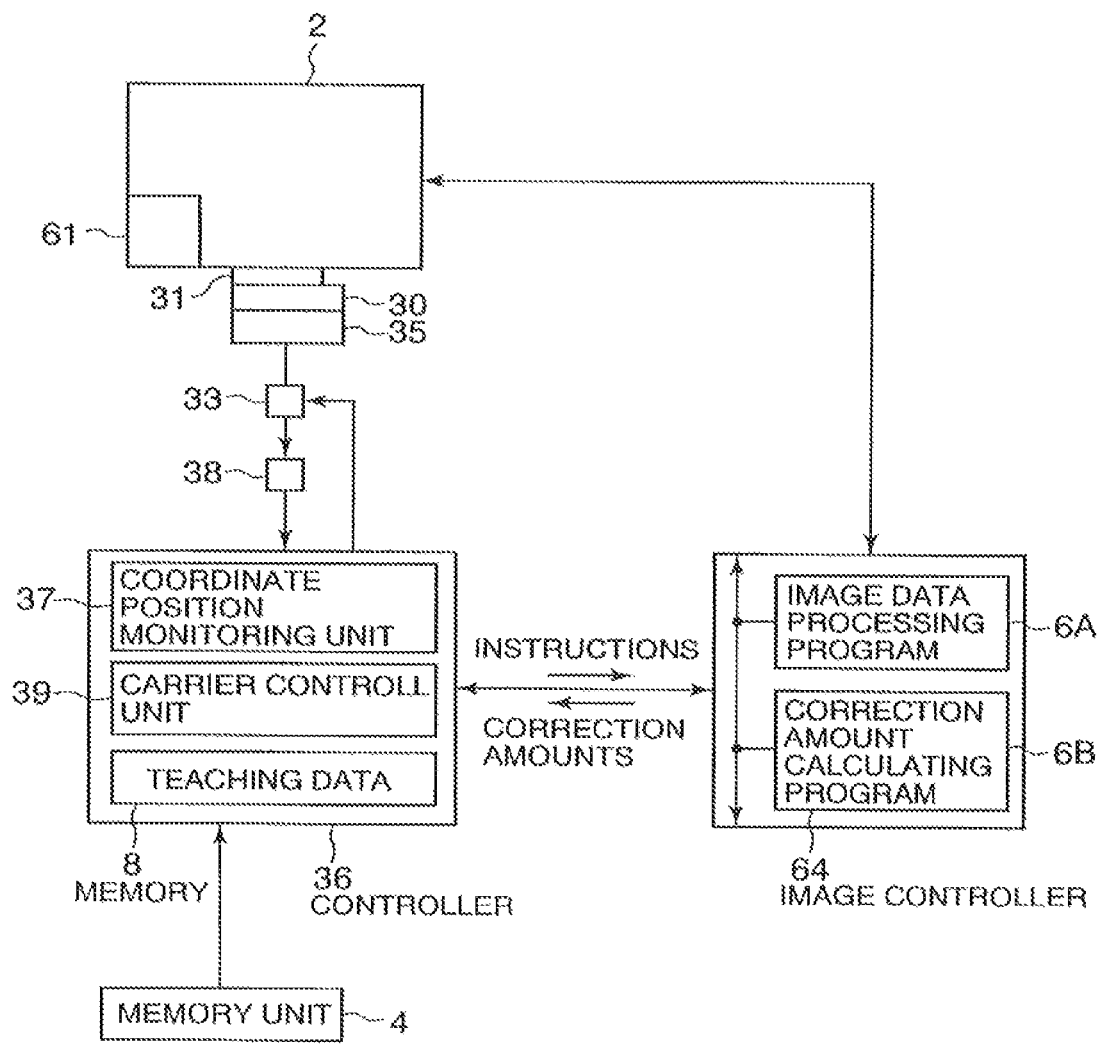
FIG. 5 is a schematic diagram showing one example of a control unit used in the substrate processing apparatus.

To the holding part 31a, projections 32 are provided, for example, in three positions, while each carrier 1 has three recesses formed in a bottom face thereof, such that the three projections 32 can be respectively fitted in the recesses of the carrier 1, when the carrier 1 is placed on the holding part 31a. Thus, each carrier 1 can be carried by the carrier arm 31, while being accurately positioned on the carrier arm 31. The aforementioned motor used for the straight movement is connected with the holding part 31a, via a change gear (not shown), such that the orientation of each carrier 1 placed on the holding part 31a can be maintained, relative to the advance and retract directions of the carrier 1, irrespectively of the position thereof. As shown in FIG. 5, an encoder 38 for a drive unit 33 composed of the aforementioned motors M, 34 and motor of the carrier arm 31 is connected with a controller 36.

The controller 36 includes a coordinate position monitoring unit 37, a carrier control unit 39 and a memory 8 for storing the teaching data therein. The coordinate position monitoring unit 37 serves to obtain a position on the coordinates of a drive system of the carrier transporter 22, more specifically, a position on the coordinates of the drive system of the holding part 31a, by obtaining the number of pulses of the encoder 38 connected with the motors for driving each axis of the carrier transporter 22. The carrier control unit 39 includes a preset operational program and serves to control the operation of the carrier transporter 22, based on the teaching data. The teaching data stored in the memory 8 corresponds to a pulse instruction value of the encoder 38 for each axis of the carrier transporter 22 provided based on a correction amount or value obtained by teaching that will be described later, i.e., data corresponding to the coordinate position of the holding part 31a on the coordinates of the drive system. It is noted that similar projections are also provided to the face, for placing the carrier 1 thereon, of each of the aforementioned load ports 21 and transfer stages 23, such that the projections can be respectively fitted in the recesses formed in the carrier 1.

Figure 6:
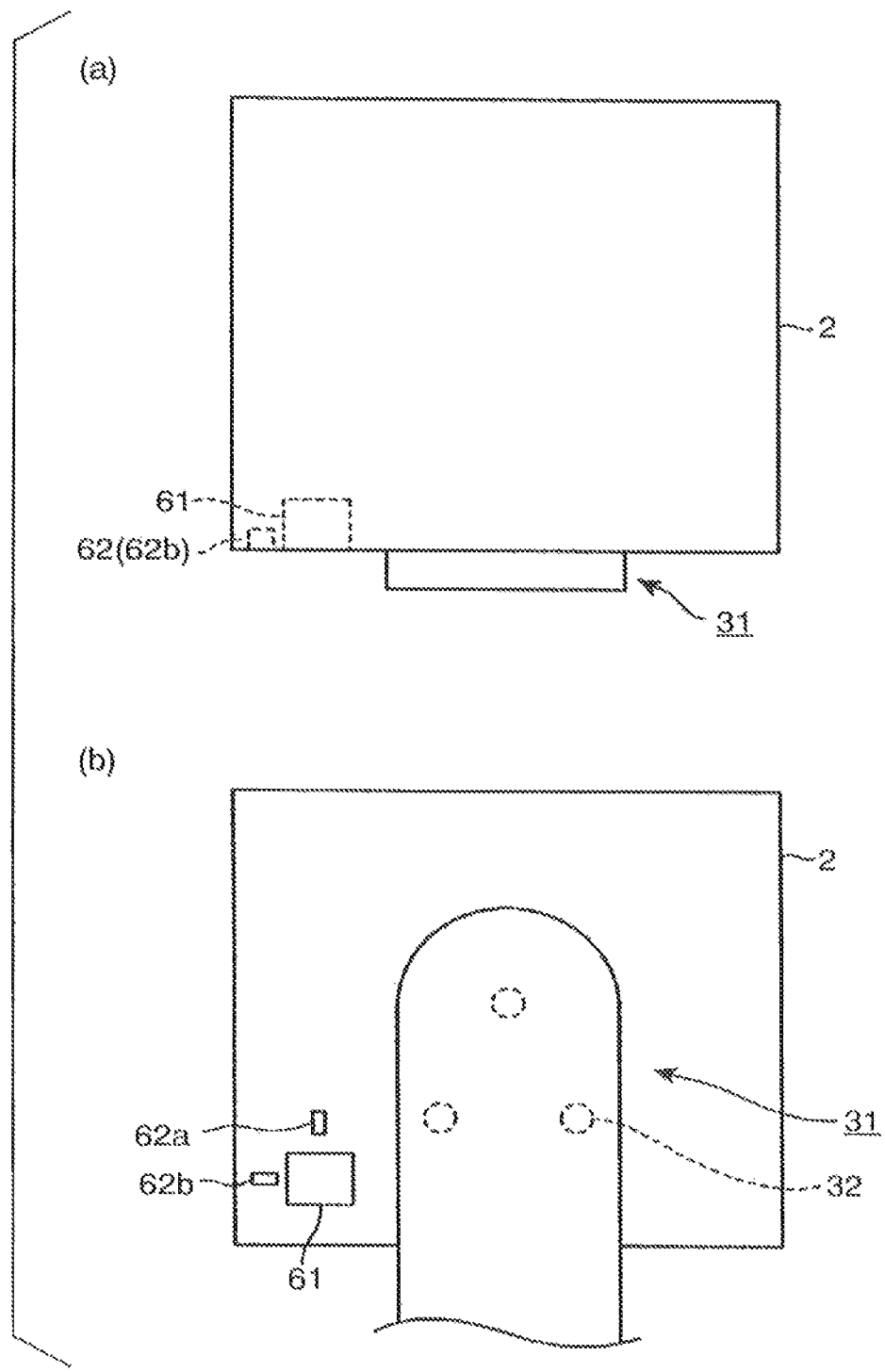
FIGS. 6(a) and 6(b) are schematic views, respectively showing one example of a carrier jig used in the substrate processing apparatus.
Figure 7:
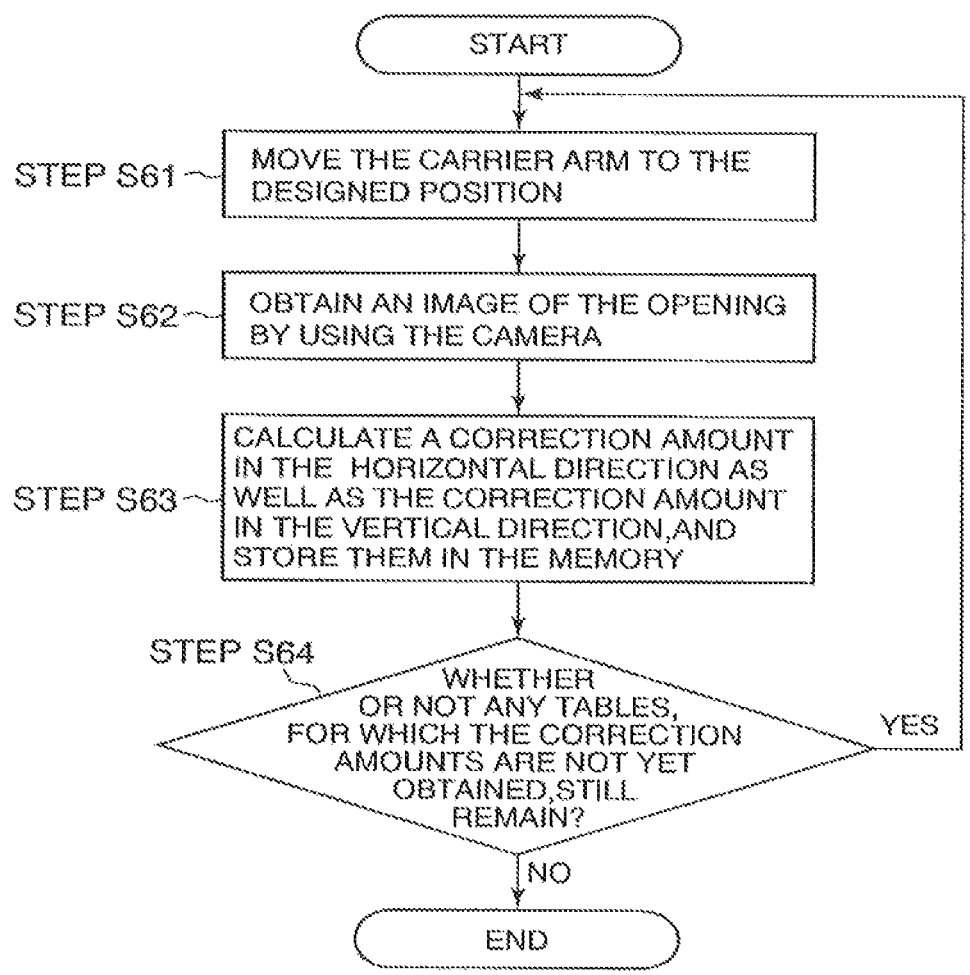
FIG. 7 is a flow chart showing one example of a procedure of teaching work performed in the substrate processing apparatus.

In this example, in order to teach the controller 36 to memorize the carrying operation of the carrier arm 31, the carrier jig 2 having the same shape as the carrier 1 is set on the carrier arm 31. While such a jig provided for performing the teaching is also referred to as "a teaching jig", this jig is herein referred to as the "carrier jig". In a bottom face of each carrier jig 2, similar recesses (not shown), to those of the carrier 1 in which the projections 32 of the holding part 31a can be fitted, are provided, such that the carrier jig 2 can take the same attitude as the carrier 1 when set on the carrier arm 31, or such that a positional relationship between the carrier 1 and the carrier jig 2 can be grasped in advance. As shown in FIG. 6, in a region of the bottom face of the carrier jig 2 outside a portion that will be in contact with the carrier arm 31, a camera 61 and light radiation parts 62a, 62b are provided, respectively. The camera 61 serves as an image obtaining (or pickup) means having a view facing downward for obtaining an image of a region including, for example, the opening 52, as the marker for detecting the positional shift, formed in each carrier stage 50. Each light radiation part 62a, 62b has a slit-like shape and is adapted for irradiating an image obtaining region for the camera 61, with light or laser having a linear beam cross section. Such light radiation parts 62a, 62b are configured to radiate two laser beams, respectively parallel to the X-Y axes of the Cartesian coordinates, in a horizontal plane controlled by a computer employed in the apparatus. In addition, the light radiation parts 62a, 62b are respectively oriented, such that linear sections respectively irradiated with the laser beams radiated therefrom can cross each other at a central portion of the image obtaining region for the camera 61.

For instance, an ideal position for the carrier arm 31 is set as a position, in which the carrier arm 31 will start to be lowered, after moved to this position while holding the carrier jig 2, so as to allow the carrier jig 2 to be securely transferred onto the carrier stage 50. In this ideal position, the central position of the image obtaining region for the camera 61 will be coincident with a central position of the opening 52. FIG. 6(a) is a view illustrating a rear face of the carrier jig 2 held on the carrier arm 31, and FIG. 6(b) is a view illustrating the bottom face of the carrier jig 2 held on the carrier arm 31.

As shown in FIG. 5, an image controller 64 is connected with the carrier jig 2, via a cable (not shown). This image controller 64 is adapted for calculating an amount of the positional shift between the central position of the image obtaining region for the camera 61 and the central position of the opening 52, after the camera 61 takes an image of the opening 52 of the carrier stage 50.

The image controller 64 includes an image data processing program 6A and a correction amount calculating program 6B. The image data processing program 6A is designed to take or obtain an image of any given region including the opening 52 by using the camera 61 and then read each coordinate position, in which each laser beam radiated from the light radiation parts 62a, 62b becomes discontinuous, in the view of the camera 61, at the periphery of the opening 52. Namely, this program 6A serves to read the position of the opening 52 surrounded or defined by points P1 to P4 that will be described later. The correction amount calculating program 6B is designed to calculate a degree of the positional shift (positional difference) between the ideal position and an actual position of the carrier arm 31, on the coordinates of the drive system, upon placing the carrier jig 2 on each of the load ports 21, transfer stages 23 and carrier stages 50, based on positional information obtained by the image data processing program 6A, as will be detailed later. Then, this program 6B will calculate a correction amount corresponding to the positional shift (positional difference). Namely, as will be described below, the correction amount calculating program 6B serves as a means for measuring a distance between the carrier jig 2 and the carrier stage 50.

In the case of the load ports 21 and transfer stages 23, the ideal position is set as a position, in which the carrier arm 31 will start to be lowered in order to allow the recesses formed in the bottom face of the carrier 1 to be securely engaged with the respective projections 32 formed on the face, for placing the carrier 1 thereon, of each of the load ports 21 and transfer stages 23. In this case the carrier 1 is allowed to be accurately transferred between the carrier transporter 22 and the transfer mechanism 42 or any other suitable external carrier mechanism (not shown) located outside the substrate processing apparatus. More specifically, in the case of the carrier stage 50, the ideal position is set such that the carrier arm 31 can be accurately located above the central position of the carrier stage 50, thereby to prevent collision between the carrier 1 with any side face of the storage unit 24, when the carrier 1 is placed on the carrier stage 50. Accordingly, in this example, the positional information on the ideal position can be obtained when the central position of the image taken by the camera 61 is coincident with the central position of the opening 52.

Each correction amount in the horizontal direction for the coordinate position of the carrier arm 31, as will be detailed later, can be obtained by irradiating with light the image obtaining region for the camera 61 including the opening 52 by using the light radiation parts 62, so as to obtain the image of the region including the opening 52 by using the camera 61, then comparing the central position of the opening 52 with the central position of the image obtaining region for the camera 61 by using image controller 64. Meanwhile, an amount or value of the positional shift (or difference) in the vertical direction, as will be detailed later, can be obtained by calculating a distance between the camera 61 and the carrier stage 50 from the image taken by the camera 61, then comparing the calculated distance with the distance, between the camera 61 and the carrier stage 50, obtained when the carrier arm 31 is assumed to be in the ideal position.

Such teaching work is performed under instructions of the controller 36. As a result, the correction amounts, respectively obtained as described above relative to the positional shift or offset, are returned to the controller 36, and then stored, as the teaching data, in the memory 8. The memory 8, as will be described later, is provided with regions for respectively storing therein designed positions on the coordinates of the drive system obtained by design information as described above and the correction amounts respectively calculated by the image controller 64. The memory 8 also includes regions for respectively storing therein the ideal positions on the coordinates, obtained by correcting the designed positions based on the correction amounts. Thereafter, each ideal position is read from the memory 8, for example, when the carrier 1 is carried after the teaching work. Further, when the ideal position is outputted to the drive unit 33, the information is transformed from a value on the Cartesian coordinates of the X-Y-Z axes into the value on the coordinates of the drive system.

As described above, an error between the designed position and the ideal position will occur, for each place or table for placing the carrier 1 thereon, due to the errors in assembling the apparatus. Thus, the correction amount will vary with each table. Accordingly, it is necessary to perform the teaching work for each region that the carrier 1 is placed thereon. Each of the programs 6A, 6B and other programs used for the drive system (e.g., the programs for input and/or display for each operational parameter) is stored in a memory unit 4 that is a computer storage medium, such as a flexible disk, a compact disk, an MO (or optical magnetic disk), a hard disk or the like, and is then installed in the controller 36. It is noted that the teaching work may be performed in another period of time than the time to start the substrate processing apparatus. For example, this work may be performed upon periodical maintenance for the apparatus.

As shown in FIG. 1, the partition wall 11 is opened, corresponding to each transfer stage 23. A shutter 70 is provided to the partition wall 11 on the side of the loading area S2, such that each opening of the wall 11 can be closed by the shutter 70. When the carrier 1 is placed on the transfer stage 23 such that an opening and closing door (not shown) provided to the carrier 1 can be opposed to the opening provided in the partition wall 11, the shutter 70 will be opened together with the opening and closing door, thus bringing the atmosphere in the carrier 1 in communication with the atmosphere in the loading area 52.

The loading area S2 is used for providing the heating process, such as the oxidizing process and/or film-forming process, to the wafers W, and is kept in an atmosphere of an inert gas, e.g., a nitrogen gas. In the loading area 52, a heating furnace 40, a vertical type processing unit having an opening, as a furnace port, at its bottom end, is provided. Further, a wafer boat 41 is provided below the heating furnace 40. The wafer boat 41 is used as a holding tool for holding the multiple sheets of wafers W, and is configured to be optionally moved in the vertical direction by a lift mechanism 41a. The furnace port of the heating furnace 40 can be opened and closed by a cover 44. Additionally, in the loading area 52, the transfer mechanism 42 is provided between the wafer boat 41 and the partition wall 11. The transfer mechanism 42 is adapted for transferring the wafers W between the carrier 1 placed on the transfer stage 23 and the wafer boat 41. To the transfer mechanism 42, for example, an arm 43, on which the multiple sheets of wafers W can be collectively placed, is provided, such that the arm 43 can be optionally advanced and retracted. Furthermore, the transfer mechanism 42 can be rotated about the vertical axis by a motor (not shown), and is configured to be optionally raised and lowered along a lift shaft 45.

Figure 8:
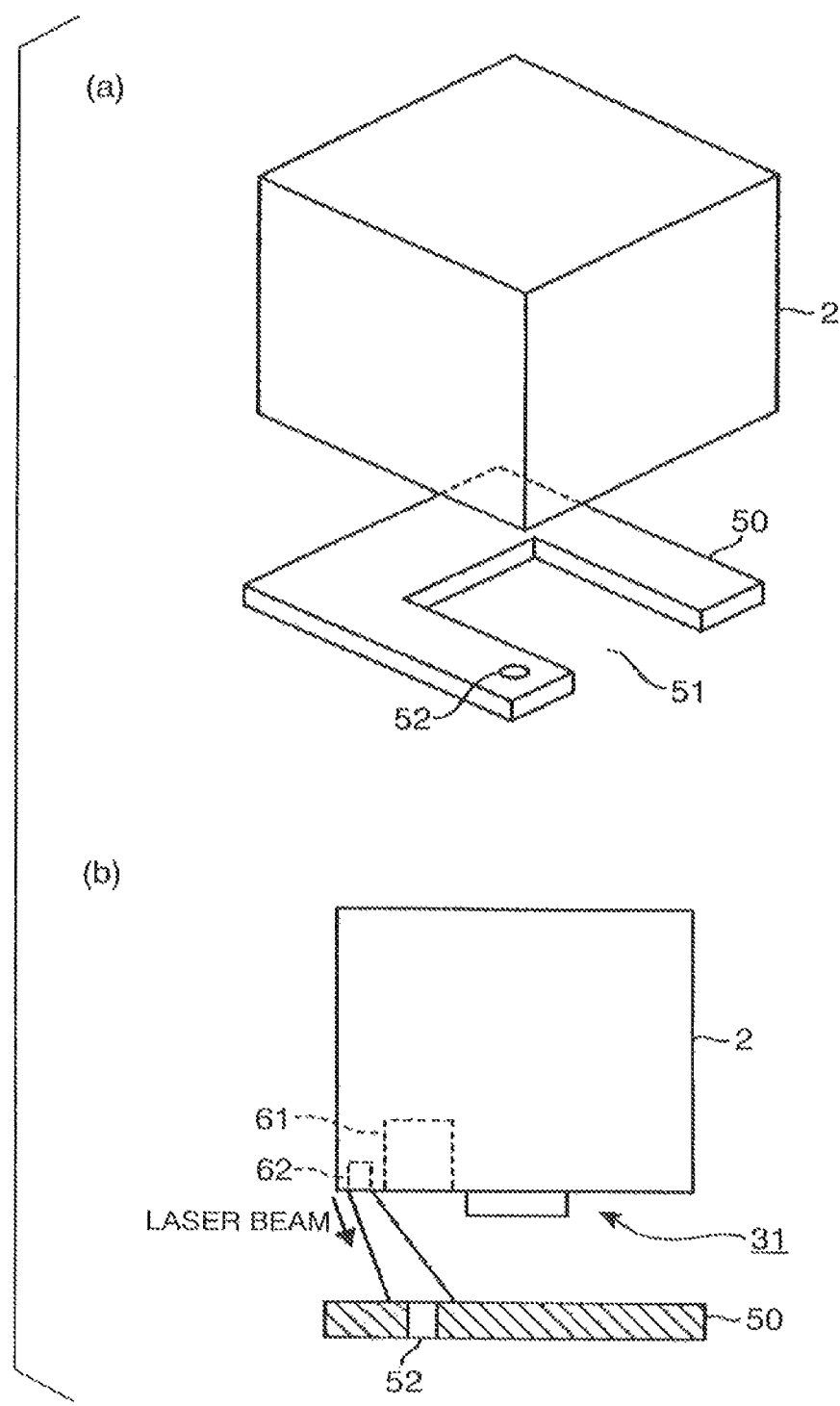
FIGS. 8(a) and 8(b) are schematic views, respectively illustrating the procedure of the teaching work performed in the substrate processing apparatus.

Next, a teaching method for the carrier means related to the present invention will be described, with reference to FIGS. 7 through 12. First, when the teaching work is performed, for example, upon starting the substrate processing apparatus, the carrier jig 2 is placed on the carrier arm 31, for example by an operator. Then, as shown in FIG. 8(*a*), the holding part 31*a* of the carrier arm 31 is advanced into, for example, one of the storage units 24, and moved up to a preset lowering start position (i.e., the designed position in which the carrier arm 31 will start to be lowered), A1 ($x_{A1}$, $y_{A1}$, $z_{A1}$), obtained by the design information (Step S61). Occasionally, such a preset lowering start position obtained by the design Information may be the same as the ideal position for the lowering start position. However, usually, such a preset lowering position is slightly different from the ideal position. In either case, in the preset lowering position, the camera 61 is positioned above the opening 52 while being opposed thereto.

Figure 10:
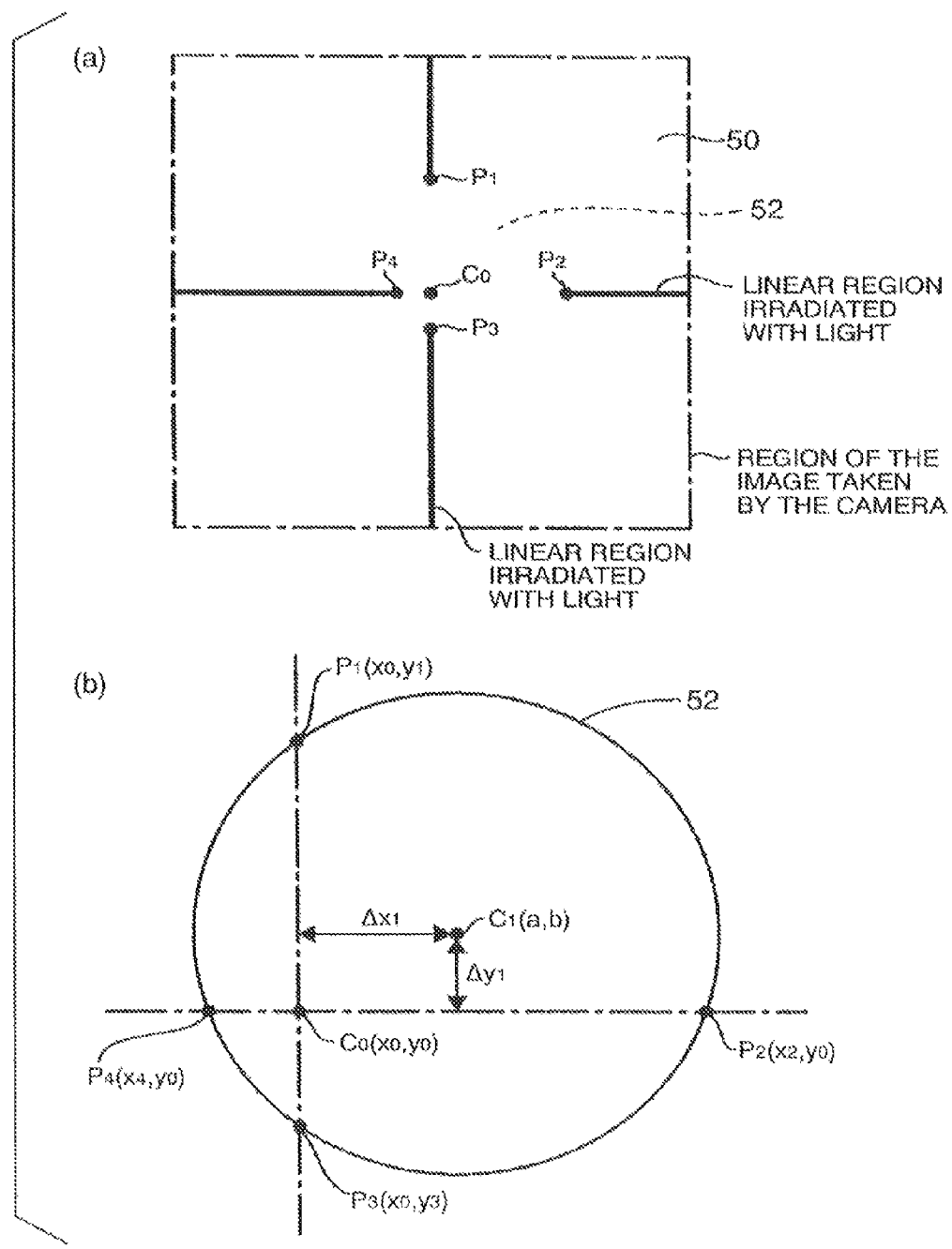
FIGS. 10(a) and 10(b) are diagrams for respectively illustrating the procedure of the teaching work performed in the substrate processing apparatus.

Thereafter, as shown in FIGS. 8(*b*) and 9, the opening 52 is irradiated with the light, such as the laser beams, radiated from the light radiation parts 62*a*, 62*b*, respectively parallel to the X-Y axes of the Cartesian coordinates in the horizontal plane, such that the laser beams can cross each other at the central position of the image obtaining region for the camera 61. Thus, the image of the region including the opening 52 can be taken or obtained by the camera 61 (Step S62). As a result, as shown in FIG. 10(*a*), an image of the opening 52 can be captured in the view of the image obtaining region for the camera 61. However, if the preset lowering start position (or designed position for the lowering start position) of the holding part 31*a* is not coincident with the ideal position for the lowering start position, the central position of the camera 61 will be different from the central position of the opening 52. In such a case, a discontinuous image of crossed lines of the radiated laser beams can be obtained at the periphery of the opening 52.

More specifically, assuming that the coordinates of the central position of the image obtaining region for the camera 61 in the above case is designated by $C_0(x_0, y_0)$, as shown in FIGS. 10(*a*), 10(*b*), the coordinates of positions, in which the crossed lines of the radiated laser beams become discontinuous at the periphery of the opening 52, can be expressed, in a clockwise order, by $P_1(x_0, y_1)$, $P_2(x_2, y_0)$, $P_3(x_1, y_3)$ $P_4(x_4, y_0)$, respectively. Thus, from these coordinates $P_1$ to $P_4$, the coordinates $C_1(a, b)$ of the center of the opening 52 can be obtained as follows:

$$a = x_0 + (x_2 + x_4)/2, \text{ and}$$

$$b = y_0 + (y_1 + y_3)/2.$$

Accordingly, on the assumption that the laser beams are radiated onto the region 52, respectively parallel to the X-Y axes of the Cartesian coordinates, the correction amounts, $\Delta x_1$ and $\Delta y_1$, respectively corresponding to the amount of the positional shift between the central position of the image obtaining region for the camera 61 and the central position of the opening 52, can be calculated as a difference between $C_0$ and $C_1$, and thus expressed as follows:

$$\Delta x_1 = (x_2 + x_4)/2, \text{ and}$$

$$\Delta y_1 = (y_1 + y_3)/2.$$

Figure 9:
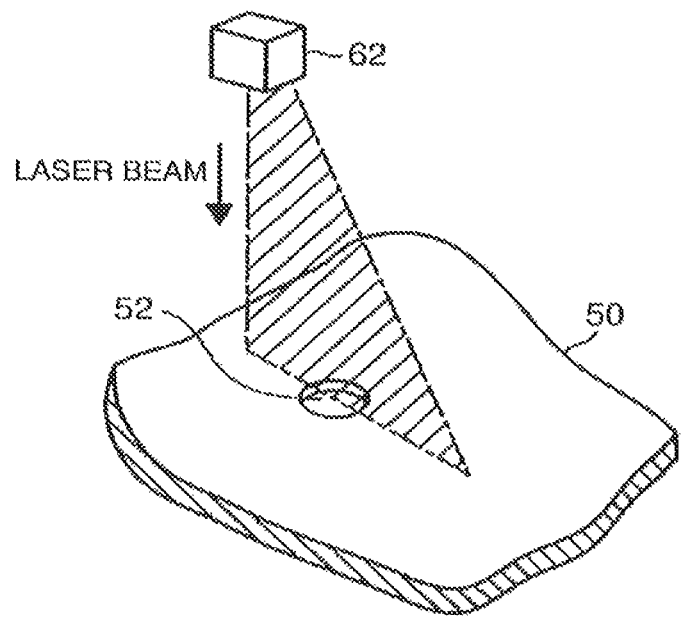
FIG. 9 is a diagram for illustrating the procedure of the teaching work performed in the substrate processing apparatus.

As described above, actual dimensions of any part included in the image taken by the camera 61 can be calculated by the image controller 64, based on the magnification of the image. Therefore, each distance between $C_1$ and $P_1$ to $P_4$, i.e., the values of $x_2$, $x_4$, $y_1$, $y_3$, can be obtained, respectively. Of course, the correction amounts, $\Delta x_1$ and $\Delta y_1$, should be zero, respectively, if the coordinates A1 of the central position of the image obtaining region for the camera 61 is not shifted from the coordinates B1 of the central position of the opening 52. It is noted that FIG. 9 illustrates, for simplification, only one of the two laser beams radiated onto the opening 52.

Figure 11:
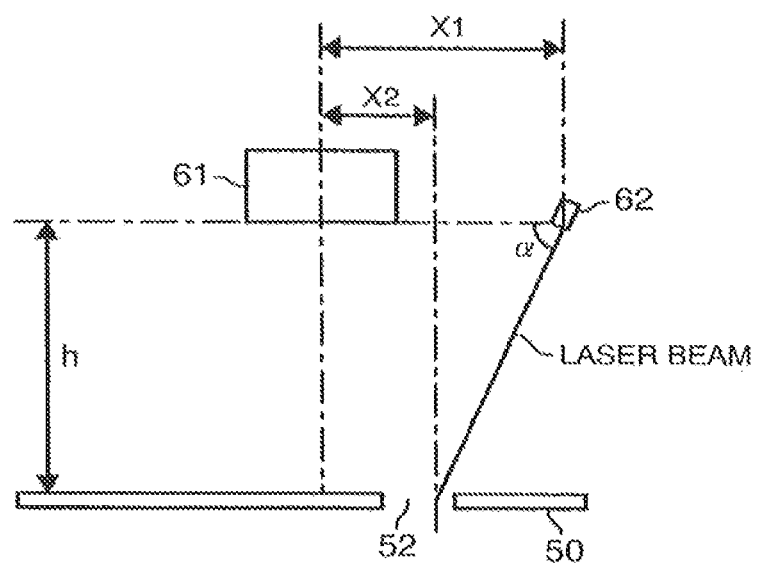
FIG. 11 is a diagram for illustrating the procedure of the teaching work performed in the substrate processing apparatus.

A distance h in the vertical direction between the carrier jig 2 and the carrier stage 50 is calculated in the following manner. Namely, as shown in FIG. 11, for example, an angle $\Delta$ defined between the linear laser beam radiated from the light radiation part 62 and the carrier jig 2 and a horizontal distance x1 between the central position of the image obtaining region for the camera 61 and the light radiation part 62 can be obtained in advance from designed data and the like. In this case, when the distance or height h is changed, a position Irradiated with the laser beam will be shifted in a lateral direction in the drawing. Therefore, with change of the position in the vertical direction of the carrier jig 2, a distance x2, between the line of the laser beam radiated on the carrier stage 50 and the central position of the image obtaining region for the camera 61, will be changed. Accordingly, based on the angle $\alpha$, distance x1 and distance x2, the vertical distance h between the carrier jig 2 and the carrier stage 50 can be calculated, in accordance with the trigonometry. It is noted that the distance h between the carrier jig 2 and the carrier stage 50 corresponds to the distance between a top face of the holding part 31*a* of the carrier arm 31 and the carrier stage 50.

Meanwhile, the angle $\alpha$, distances x1 and x2, when the holding part 31*a* of the carrier arm 31 is assumed to be in the ideal position of the lowering start position, can also be obtained, with ease, such as by the designed data, calculations, experiments and the like. Thus, by comparing the height $h_0$ of the carrier jig 2 in such an ideal case with the distance h calculated as described above, a correction amount $\Delta z_1$ ($= |h_0 - h|$) In the vertical direction can be obtained.

Thereafter, as described above, the correction amounts $\Delta x_1$, $\Delta y_1$, $\Delta z_1$ are stored in the memory 8 of the controller 36 from the image controller 64 (Step S63). Then, designed coordinates of the carrier arm 31 (specifically, the designed coordinates of the holding part 31*a*), A1 ($x_{A1}$, $y_{A1}$, $z_{A1}$), are corrected, with the respective correction amounts $\Delta x_1$, $\Delta y_1$, $\Delta z_1$, and the so-corrected coordinates, i.e., the ideal coordinates B1 ($x_{B1}$, $y_{B1}$, $z_{B1}$), will also be stored in the memory 8. These X, Y and Z axial coordinates correspond, respectively, to the amount of transfer of the entire carrier arm 31 driven by the motor along the horizontal arm 26, amount of the advance and retract of the carrier arm 31 actuated by the motor and amount of the vertical movement of the horizontal arm 26 driven by the motor M. Namely, such X, Y and Z axial coordinates correspond to the position of the carrier arm 31, at any given time, on the coordinates of the drive system. More specifically, for the correction of the position of the carrier arm 31 on the coordinates of the drive system, the amount of transfer of the carrier arm 31, in the horizontal direction, for one pulse of the encoder connected with each motor, is used as a unit for the respective correction amounts $\Delta x_1$, $\Delta y_1$. Meanwhile the amount of transfer of the carrier arm 31, in the vertical direction, corresponding to one pulse of the encoder of the motor M, is used as the unit for the correction amount $\Delta z_1$.

Once the ideal position for the lowering start position of the holding part 31*a* of the carrier arm 31 is obtained, the holding part 31*a* of the carrier arm 31 will be set at the ideal position for the lowering start position. Then, for actually carrying the carrier 1, the transfer arm 31 will be lowered through the recess 51 of the carrier stage 50, in accordance with a preset typical operational sequence, so as to place the carrier 1 on the carrier stage 50. Thereafter, the transfer arm 31 will be further lowered, and then retracted.

After the transfer arm is retracted, it is checked whether or not any tables, for which the correction amounts are not yet obtained, still remain. If such a table or tables are present, the teaching will be further performed for them in the same manner as described above (Step S64). In this way, as shown in FIG. 12, the designed positions $A_1$ to $A_{20}$, correction amounts ($\Delta x_1$, $\Delta y_1$, $\Delta z_1$) to ($\Delta x_{20}$, $\Delta y_{20}$, $\Delta z_{20}$) and ideal coordinates B1 to B20, respectively corresponding to positions, to which the carriers are carried, are stored in the memory 8, respectively. Thereafter, the carrier jig 2 is removed from the carrier arm 31, and the teaching work is ended.

Next, the transfer of each carrier 1 through the entire system of the substrate processing apparatus will be explained briefly. First, when the carrier 1 is placed on the load port 21 via the transfer port 20 by the external carrier means (not shown), the carrier arm 31 is moved to a calculated lower position from an upper position that is the ideal position for the load port 21. Subsequently, the carrier arm 31 is elongated or advanced, and then the holding part 31a of the carrier arm 31 is raised to receive the carrier 1 thereon. Thereafter, the carrier arm 31 is retracted in the upper position, then moved to carry the carrier 1 toward the transfer stage 23. Once the carrier arm 31 reaches the transfer stage 23, the holding part 31a of the carrier arm 31 is moved to the ideal position of the lowering start position. Then, the holding part 31a of the carrier arm 31 is lowered toward a lower position, so as to place the carrier 1 on the face, for placing the carrier 1 thereon, of the transfer stage 23. Thereafter, the carrier arm 31 is retracted at the lower position.

On the transfer stage 23, the opening and closing door (not shown) of the carrier 1 is closely contacted with the partition wall 11, and is then opened together with the shutter 70. Thus, the wafers W can be taken out form the carrier 1 by the transfer mechanism 42, and then transferred onto the wafer boat 41. Meanwhile, the left vacant carrier 1 is transferred to and stored in the storage unit 24, by the carrier arm 31, for which the coordinates are corrected in the same manner as described above. In this way, the carriers 1 are carried into the working area S1, successively, until a predetermined number of sheets, for example, 100 sheets, of wafers W are transferred onto the wafer boat 41. Then, the left vacant carriers 1 are stored in the storage units 24, respectively.

Once the wafer boat 41 is elevated and placed in the heating furnace 40, the furnace port provided at the bottom end of the heating furnace 40 is closed. Then, a predetermined heating process is provided to the wafers W. After the heating process, the wafers W are returned to each carrier 1 in a reverse order to the order in which the wafers were loaded onto the wafer boat 41. Thereafter, the carriers 1 are carried out of the substrate processing apparatus in the same manner. It should be appreciated that each storage unit 24 may be used to temporarily store therein the carrier 1 in which unprocessed wafers W are stored, after the carrier 1 is first carried in the substrate processing apparatus.

In the substrate processing apparatus according to the aforementioned embodiment, the carriers 1, each storing therein the plurality of wafers W are carried into the apparatus, the wafers W from each carrier 1 are taken out, then a desired process to the wafers W is performed. The teaching work, for the position of the carrier arm 31 adapted for transferring the carrier 1 to and from the respective tables, is performed, for example, upon starting the operation of the substrate processing. In this case, the carrier jig 2 is placed on the carrier arm 31, and is moved to an upper position relative to, for example, the carrier stage 50. Then, the image of the region including the opening 52 of the carrier stage 50 is taken by the camera 61. Subsequently, each amount of the positional shift, in the horizontal direction, between the central position of the image obtaining region for the camera 61 and the central position of the opening 52, is obtained. Meanwhile, as described above, the positional relationship between the central position of the image obtaining region for the camera 61 and the central position of the opening 52 as well as the positional relationship between the carrier 1 and the carrier jig 2, each held by the carrier arm 31, are known, in advance, respectively. Namely, in such positional relationships, the central position of the image obtaining region for the camera 61 is set to be the same as the central position of the opening 52, while the carrier 1 held by the carrier arm 31 is set to take the same attitude as the carrier jig 2. Accordingly, the positional shift, in the horizontal direction, between the central position of the image obtaining region for the camera 61 and the central position of the opening 52 can be obtained, based on such positional relationships. As a result, the positional shift between the carrier 1 and the carrier stage 50 can also be obtained. Accordingly, by correcting the coordinates of the carrier arm 31, based on the amount of such a positional shift, the teaching work about the position of the carrier arm 31 above the carrier stage 50, on the coordinates of the drive system, can be performed. Thus, the teaching work can be carried out, without relying on the work of the operator in accordance with the manual. Therefore, the errors in the teaching work, due to a degree of experience and skill of the operator and/or mistakes made by the operator upon an input operation or the like, can be significantly reduced, even in the case in which the tables or other like places, for respectively placing the carriers 1 thereon, are provided in many positions, as with the above substrate processing apparatus. In addition, the time required for the teaching work can be substantially reduced.

Because the periphery of the opening 52 can be readily determined or discriminated by using the laser beams, the teaching work can be performed in a considerably simple manner. Besides, since the position in the vertical direction of the holding part 31a of the carrier arm 31 can be obtained, based on the vertical distance between the carrier stage 50 and the carrier jig 2, the teaching work can also be performed in regard to the vertical direction of the carrier arm 31.

In the above teaching method for the carrier means, while the coordinates of the position of the opening 52 have been separately obtained (i.e., for the coordinates $C_1$ of the center thereof and distance h in the vertical direction), such coordinates may be obtained at a time. For instance, such three-dimensional coordinates can be obtained, simultaneously, by employing, for example, stereo measurement in the so-called slit-light projection method, as described in the following Reference 1.

(Reference 1)
  Title: Three-dimensional Image Measurement
  Author: Masashi Iguchi, Kōske Satō
  Publisher: SHŌKŌDŌ (1990/11)
  ISBN-10: 4785690364
  Pages: 91 to 97

Usually, the designed position in the vertical direction of the holding part 31a of the carrier arm 31 is not so shifted from the ideal position thereof. Therefore, only each amount of the positional shift (or correction amount) in the horizontal direction may be obtained by taking the image of the opening 52 by using the camera 61, without correcting or changing the designed vertical position into the ideal position.

Alternatively, the camera 61 and light radiation parts 62 may be provided on a top face of the carrier jig 2, while facing upward, respectively. In such a case, the ideal position is obtained in a lower position relative to the table. Thus, the ideal position of the lowering start position for the carrier arm 31 is calculated, based on the coordinates of the lower position. It should be appreciated that the teaching work for the carrier arm 31, which is performed in a position more adjacent to the table than the upper position or lower position, or performed in a position farther from the table than the upper position or lower position, may also be within the scope of this invention.

In regard to the calculation of the central position of the opening 52 by utilizing the discontinuous positions of each laser beam at the periphery of the opening 52, any suitable surface treatment for preventing reflection of the laser beam may be provided to the table, such as the carrier stage 50 or the like, in place of using the opening 52 formed therein. Furthermore, while the laser beams are radiated from the light radiation parts 62 when the image of the opening 52 is taken by the camera 61, the periphery of the opening 52 may be directly read from the image thereof taken by the camera 61, without such radiation of the laser beams onto the opening 52. Additionally, while the central position of the image obtaining region for the camera 61 is set to be the same as the central position of the opening 52 when the carrier arm 31 is in the ideal position, the setting of the camera 61 is not limited to such an aspect. For instance, the camera 61 may be set, such that another particular positional relationship between the image obtaining region thereof and the opening 52 can be obtained when the carrier arm 31 is in the ideal position. Furthermore, in the above example, the opening 52 is formed in each carrier stage 50, such that the image thereof can be taken by the camera 61. However, for example, a cross-shaped marker may be provided or printed on the carrier stage 50, in place of forming the opening 52 therein. In addition, the distance, in the vertical direction, between the carrier jig 2 and the carrier stage 50 may be measured by using, for example, any suitable distance recorder separately provided to the carrier jig 2.

Additionally, in the above example, the carrier jig 2 (or carrier 1) is carried, while being placed on the carrier arm 31. However, the carrier jig 2 may be carried, while the top face of the carrier jig 2 is held by the carrier arm 31.

It should be appreciated that this invention can be applied not only to the batch-type heating apparatus as described above, but also applied to a washing apparatus or the like that is adapted for collectively washing the substrates, such as the wafers W or the like stored in each carrier 1, with a cleaning liquid. In such a case, a similar effect, for teaching any suitable carrier means adapted for carrying the carriers 1 into the washing apparatus, can be obtained.

The invention claimed is:

1. A method for teaching a carrier means, wherein the method is used for a substrate processing apparatus including a table for placing thereon a carrier container storing substrates therein, the carrier means, which has a holding part for holding the carrier container, a drive unit and a measuring means, and is adapted for transferring the carrier container onto the table, a coordinate position monitoring unit adapted for monitoring a coordinate position of the holding part on the coordinates of a drive system, in both of horizontal and vertical directions, based on an output of an encoder connected with the drive unit of the carrier means, and a carrier control unit adapted for controlling the carrier means, the method comprising the steps of:

having the holding part of the carrier means hold a carrier jig, in a predetermined position of the holding part, the carrier jig being provided with an image obtaining means facing downward and including a light radiation part adapted for radiating light onto a region including a marker provided to the table;

having the holding part of the carrier means move to a preset lowering start position, in which the holding part will start to be lowered;

obtaining an image of the marker provided to the table and used for detecting a positional shift, by using the image obtaining means to radiate light onto the region including the marker and obtain an image of a position irradiated with the light in the region including the marker, comparing a position of the marker obtained in the image obtained by the image obtaining means, with the position of the marker in a view of the image obtaining means when the holding part is assumed to be in an ideal position of the lowering start position, while measuring a distance in the vertical direction between the holding part and the table by using the measuring means, further comparing the measured distance in the vertical direction with the distance in the vertical direction between the holding part and the table when the holding part is assumed to be in the ideal position of the lowering start position, calculating each correction amount, in both of the horizontal and vertical directions, for the lowering start position, then storing the calculated correction amount in a memory, whereby the preset lowering start position can be corrected with the correction amount, thereby obtaining the coordinate position of the holding part on the coordinates of a drive system, in both of the horizontal and vertical directions, corresponding to the corrected lowering start position of the holding part.

2. A method for teaching a carrier means, wherein the method is used for a substrate processing apparatus including a table for placing thereon a carrier container storing substrates therein, the carrier means, which has a holding part for holding the carrier container, a drive unit and a measuring means, and is adapted for transferring the carrier container onto the table, a coordinate position monitoring unit adapted for monitoring a coordinate position of the holding part on the coordinates of a drive system, based on an output of an encoder connected with the drive unit of the carrier means, and a carrier control unit adapted for controlling the carrier means, the method comprising the steps of:

having the holding part of the carrier means hold a carrier jig, in a predetermined position of the holding part, the carrier jig being provided with an image obtaining means facing upward and including a light radiation part adapted for radiating light onto a region including a marker provided to the table;

actuating the carrier means to move the holding part of the carrier means to a preset lower position below the table;

obtaining an image of the marker provided to the table and used for detecting a positional shift, by using the image obtaining means to radiate light onto the region including the marker and obtain an image of a position irradiated with the light in the region including the marker, comparing a position of the marker obtained in the image obtained by the image obtaining means, with the position of the marker in a view of the image obtaining means when the holding part is assumed to be in an ideal position of the lower position, while measuring a distance in the vertical direction between the holding part and the table by using the measuring means, further comparing the measured distance in the vertical direction with the distance in the vertical direction between the holding part and the table when the holding part is assumed to be in the ideal position of the lower position, calculating a correction amount for the lower position, then storing the calculated correction amount in a memory, whereby the preset lower position can be corrected with the correction amount, so as to obtain a corrected lower position of the holding part, thereby obtaining the coordinate position of the holding part on the coordinates of a drive system, in both of horizontal and vertical directions, corresponding to a lowering start position in which the holding part will start to be lowered, from the corrected lower position.

\* \* \* \* \*